United States Patent
Ryan

(10) Patent No.: US 10,003,451 B2
(45) Date of Patent: Jun. 19, 2018

(54) DUAL-INPUT, HIGH POWER HANDLING, POWER COMBINING LNA FOR FULL DUPLEX COMMUNICATIONS SYSTEMS

(71) Applicant: MACOM Technology Solutions Holdings, Inc., Lowell, MA (US)

(72) Inventor: David Ryan, Co. Cork (IE)

(73) Assignee: MACOM TECHNOLOGY SOLUTIONS HOLDINGS, INC., Lowell, MA (US)

(*) Notice: Subject to any disclaimer, the term of this patent is extended or adjusted under 35 U.S.C. 154(b) by 110 days.

(21) Appl. No.: 15/142,077

(22) Filed: Apr. 29, 2016

(65) Prior Publication Data

US 2017/0104573 A1  Apr. 13, 2017

Related U.S. Application Data

(60) Provisional application No. 62/238,824, filed on Oct. 8, 2015.

(51) Int. Cl.
| | |
|---|---|
| *H04B 1/40* | (2015.01) |
| *H03F 3/193* | (2006.01) |
| *H04L 5/14* | (2006.01) |
| *H03F 3/24* | (2006.01) |

(52) U.S. Cl.
CPC .............. *H04L 5/14* (2013.01); *H03F 3/193* (2013.01); *H03F 3/245* (2013.01); *H04B 1/40* (2013.01); *H03F 2200/294* (2013.01); *H03F 2200/411* (2013.01); *H03F 2200/451* (2013.01)

(58) Field of Classification Search
CPC .................................. H04L 5/14; H04B 1/40
See application file for complete search history.

(56) References Cited

U.S. PATENT DOCUMENTS

| | | | | |
|---|---|---|---|---|
| 6,169,912 B1* | 1/2001 | Zuckerman | ............ | H04B 1/525 455/570 |
| 6,915,112 B1* | 7/2005 | Sutton | .................... | H04B 1/126 455/115.3 |
| 6,934,541 B2* | 8/2005 | Miyatani | ................ | H01Q 3/267 375/E1.029 |
| 7,349,505 B2* | 3/2008 | Blount | ................... | H04B 1/525 375/211 |
| 8,135,360 B2* | 3/2012 | Taki | ..................... | G06K 7/0008 340/10.1 |
| 8,576,752 B2 | 11/2013 | Sarca | ............................ | 370/277 |
| 2003/0107434 A1* | 6/2003 | Mitzlaff | ................ | H03F 1/0222 330/149 |
| 2007/0030076 A1* | 2/2007 | Kim | ........................ | H03F 1/223 330/311 |
| 2007/0049215 A1* | 3/2007 | Chen | .................... | H03D 7/1441 455/86 |

(Continued)

*Primary Examiner* — Rasheed Gidado
(74) *Attorney, Agent, or Firm* — Thomas | Horstemeyer, LLP; Michael J. D'Aurelio; Jason M. Perilla

(57) ABSTRACT

An apparatus includes a first gain stage, a combiner and a second gain stage. The first gain stage may be configured to amplify a receive signal acquired from a circuit to generate an intermediate signal. The combiner may be configured to combine the intermediate signal with a cancellation signal to generate a combined signal. The cancellation signal is generally derived from a transmit signal a portion of which appears in the receive signal through the circuit. The second gain stage may be configured to amplify the combined signal to generate an output signal.

20 Claims, 7 Drawing Sheets

(56) References Cited

U.S. PATENT DOCUMENTS

| | | | | |
|---|---|---|---|---|
| 2007/0117524 | A1* | 5/2007 | Do | H04B 1/44 455/83 |
| 2008/0224829 | A1* | 9/2008 | Kuramoto | H04B 5/0062 340/10.5 |
| 2009/0042521 | A1* | 2/2009 | Otaka | H04B 1/0475 455/126 |
| 2009/0174481 | A1* | 7/2009 | Chang | H03F 1/223 330/277 |
| 2010/0033231 | A1* | 2/2010 | Quesada | G01N 15/00 327/509 |
| 2011/0019722 | A1* | 1/2011 | Amirkhany | H04L 25/14 375/219 |
| 2015/0208945 | A1* | 7/2015 | Lux | A61B 5/0507 600/430 |
| 2015/0318976 | A1* | 11/2015 | Eltawil | H04B 1/123 370/278 |

* cited by examiner

DUAL-INPUT, HIGH POWER HANDLING, POWER COMBINING LNA FOR FULL DUPLEX COMMUNICATIONS SYSTEMS

This application relates to U.S. Provisional Application No. 62/238,824, filed Oct. 8, 2015, which is hereby incorporated by reference in its entirety.

FIELD OF THE INVENTION

The present invention relates to full duplex communications generally and, more particularly, to a method and/or apparatus for implementing a dual-input, high power handling, power combining LNA (low-noise amplifier) for full duplex communications systems.

BACKGROUND

Conventional full duplex communication systems support transmission and reception at a same frequency at a same time. Part of a transmitted signal is commonly coupled to a received signal through non-ideal isolation of a circulator. To improve the reception during the transmission, a power combining network is implemented to cancel the coupled transmitted signal from the received signal. The power combining network is normally positioned between the circulator and a low-noise amplifier. The power combining network results in an increased signal attenuation and an increased noise figure in the receive signal.

It would be desirable to implement a dual-input, high power handling, power combining low-noise amplifier for full duplex communications systems.

SUMMARY

The present invention concerns an apparatus including a first gain stage, a combiner and a second gain stage. The first gain stage may be configured to amplify a receive signal acquired from a circuit to generate an intermediate signal. The combiner may be configured to combine the intermediate signal with a cancellation signal to generate a combined signal. The cancellation signal is generally derived from a transmit signal a portion of which appears in the receive signal through the circuit. The second gain stage may be configured to amplify the combined signal to generate an output signal.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the invention include providing a dual-input, high power handling, power combining low-noise amplifier for full duplex communications systems that may (i) avoid a power combiner between a circulator and a low-noise amplifier, (ii) reduce signal attenuation before the low-noise amplifier, (iii) improve a system noise figure, (iv) improve a reception performance, (v) implement a high power low-noise amplifier and/or (vi) be implemented in an integrated circuit.

Various embodiments of the invention generally combine a high frequency receive signal (e.g., a radio frequency signal, a microwave signal or a millimeter wave signal) and a feedback (or cancellation) signal at an intermediate node inside a low-noise amplifier. The intermediate node may be positioned after an initial gain stage among multiple gain stages in the low-noise amplifier. Since an input port of the low-noise amplifier may be exposed to a leakage signal from a transmitter, input circuitry of the low-noise amplifier may be robust to handle modest power levels to large power levels. In various embodiments, the input circuitry may be implemented with active devices (e.g., transistors) to amplify a receive signal and the feedback signal linearly up to approximately one watt of average input power. The active devices may be implemented on a range of semiconductor substrates that include, but are not limited to, gallium nitride (GaN)(on silicon or silicon-carbide substrates), gallium arsenide (GaAs), silicon-germanium (SiGe) and/or silicon-on-insulator (SOI) substrates. A resulting advantage over common solutions is a reduction in signal loss before the low-noise amplifier. The reduced signal loss generally reduces a system noise figure and improves a system performance.

Figure 1:
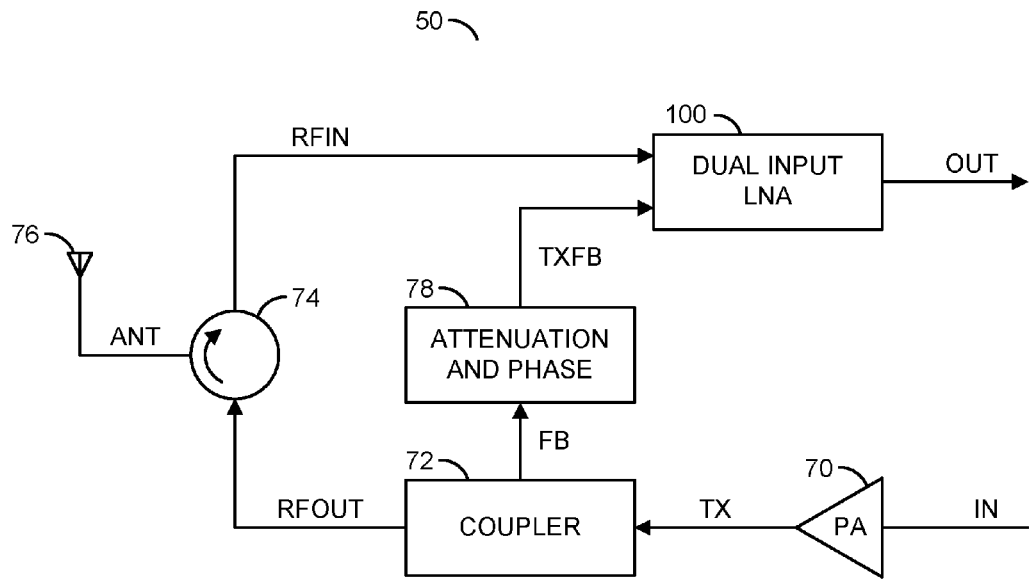
FIG. 1 is a block diagram of an apparatus.

Referring to FIG. 1, a block diagram of an apparatus 50 is shown. The apparatus (or system or circuit or integrated circuit) 50 may implement a transmit/receive (T/R) device (or module). The apparatus 50 generally comprises a block (or circuit) 70, a block (or circuit) 72, a block (or circuit) 74, a block (or circuit) 76, a block (or circuit) 78 and a block (or circuit) 100. In various embodiments, the apparatus 50 may be implemented as one or more integrated circuits.

A bidirectional signal (e.g., ANT) may be transferred between the circuit 74 and the circuit 76. The signal ANT may be an antenna signal. The signal ANT generally conveys transmit data to be transmitted wirelessly by the circuit 76. The signal ANT may also convey receive data that has been received wirelessly by the circuit 76. The transmit data and the receive data may reside in the signal ANT simultaneously. The transmit data and the receive data may be implemented as radio frequency signals, microwave signals or millimeter wave signals. The radio frequency signals generally include signals having frequencies above approximately 300 kilohertz (kHz). The microwave signals may include signals in a band of frequencies between 300 megahertz (MHz) and 300 gigahertz (GHz). The millimeter wave signals may include signals in a band of frequencies between 30 GHz and 300 GHz. Other frequencies ranges and/or bands may be implemented to meet the design criteria of a particular application.

A signal (e.g., IN) may be received by the circuit 70. The signal IN may be an input signal to the apparatus 50. The signal IN may carry the transmit data in a low power state (or condition). A signal (e.g., TX) may be generated by the circuit 70 and transferred to the circuit 72. The signal TX may implement a transmit signal. The signal TX may carry the transmit data in a high power state (or condition). The circuit 72 may generate a signal (e.g., RFOUT) received by the circuit 74. The signal RFOUT generally implements a radio frequency output signal. The signal RFOUT may carry the transmit data in the high power state. The circuit 72 may also generate a signal (e.g., FB) received by the circuit 78. The signal FB may be a transmit feedback (or cancellation) signal. The signal FB may carry the transmit data in a reduced power state (or condition). A signal (e.g., TXFB) may be generated by the circuit 78 and presented to the circuit 100. The signal TXFB may implement another transmit feedback (or cancellation) signal. The signal TXFB may convey a portion of the transmit data in the signal FB that has been attenuated and/or possibly phase shifted.

A signal (e.g., RFIN) may be generated by the circuit 74 and transferred to the circuit 100. The signal RFIN may implement a radio frequency input signal. The signal RFIN may carry the receive data and a portion of the transmit data that has leaked through the circuit 74. The circuit 100 may generate a signal (e.g., OUT). The signal OUT may implement an output signal from the apparatus 50. The signal OUT generally conveys the receive data in an amplified state (or condition). The leaked portion of the transmit data in the signal RFIN may be partially or totally removed from the signal OUT.

The circuit 70 may implement a power amplifier (PA) circuit. The power amplifier 70 is generally operational to amplify the signal IN to increase the transmit power. The amplified transmit data may be presented in the signal TX. In various embodiments, the transmit power in the signal TX may be approximately a fraction of a watt (e.g., 0.25 watts or 24 dBm (decibel-milliwatts)) for an indoor pico-cell full duplex wireless transceiver. In other embodiments, the transmit power in the signal TX may be approximately several watts (e.g., 5 watts or 37 dBm) for a micro-cell full duplex wireless transceiver. In still other embodiments, the transmit power in the signal TX may be up to or above approximately several tens of watts (e.g., 80 watts or 49 dBm) for a macro base station full duplex wireless transceiver. Other power levels and/or power ranges may be implemented to meet the design criteria of a particular application.

The circuit 72 may implement a coupler circuit. In some embodiments, the coupler 72 may be implemented as a passive coupler circuit. The coupler 72 is generally operational to couple a portion of the signal TX power into the signal FB. The signal FB may represent a small portion of power in the signal TX.

The circuit 74 may implement a circulator circuit. The circulator 74 may be operational to route the transmit data acquired in the signal RFOUT into the signal ANT for transmission. The circulator 74 may also be operation to route the receive data acquired in the signal ANT to the signal RFIN. A small fraction of the transmit data power in the signal RFOUT may leak through the circulator 74 and appear in the signal RFIN. A typical isolation of the circulator 74 between the signal RFOUT and the signal RFIN may be approximately several tens of decibels (dB) (e.g., 20 dB). As such, leakages of the transmit data in the signal RFOUT into the signal RFIN may be in a range of approximately several decibel-milliwatts (e.g., approximately 4 dBm to approximately 20 dBm).

The circuit 76 may implement an antenna. The antenna 76 may be operational to broadcast the transmit data wirelessly. The transmit data may be acquired by the antenna 76 from the circulator 74 via the signal ANT. The antenna 76 may also be operational to receive the receive data wirelessly. The receive data may be presented to the circulator 74 in the signal ANT.

The circuit 78 may implement an attenuation and phase shift circuit. The circuit 78 is generally operational to attenuate and/or phase shift the transmit data received in the signal FB. The attenuated/phase shifted transmit data may be presented in the signal TXFB to the circuit 100. The signal TXFB may convey several tens of decibel-milliwatts (e.g., >0 dBm to approximately 30 dBm) of peak power to the circuit 100. In various embodiments, the amount of attenuation may be adjustable. For example, the attenuation may be adjustable over a range of approximately 0 dB to approximately 30 dB, or greater. In some embodiments, the amount of phase shifting may be adjustable. For example, the phase may be shifted by 0 degrees to 360 degrees.

The circuit 100 may implement a low-noise amplifier (LNA) circuit. In various embodiments, the LNA 100 may implement a dual-input LNA. The LNA 100 is generally operational to amplify the receive data in the signal RFIN through multiple amplification (or gain) stages. The LNA 100 may also be operation to cancel the transmit data from the receive data in the signal RFIN based on the cancellation feedback information received in the signal TXFB. The cancellation generally occurs after an initial gain stage of the multiple amplification stages. The cancellation may be designed to work with low power to modest power levels in the signal TXFB. The amplification is generally designed to work at low power levels in the signal RFIN and to introduce a low amount of noise during the amplification.

In various embodiments, an input 1 dB compression point (IP1 dB) of the LNA 100 at high power may be greater than approximately several decibel-milliwatts (e.g., approximately 14 dBm peak power). The IP1 dB measurement may be a one dB compression point of the LNA 100 referenced to an input node. By way of comparison, the LNAs in typical base stations have an IP1 dB of less than −4 dBm.

Figure 2:
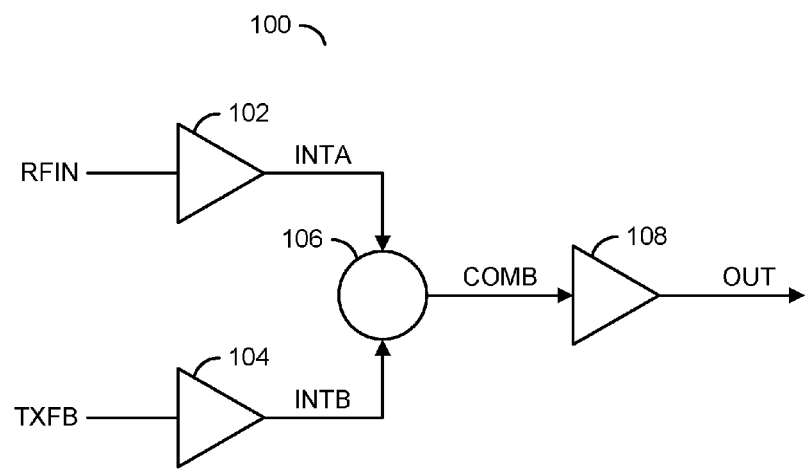
FIG. 2 is a block diagram of a low-noise amplifier of the apparatus.

Referring to FIG. 2, a block diagram of an example implementation of the LNA 100 is shown in accordance with an embodiment of the present invention. The LNA 100 generally comprises a block (or circuit) 102, a block (or circuit) 104, a block (or circuit) 106 and one or more blocks (or circuits) 108. A single circuit 108 is shown for clarity.

The circuit 102 may receive the signal RFIN. The signal TXFB may be received by the circuit 104. The circuit 108 may generate the signal OUT. The circuit 102 may generate a signal (e.g., INTA) received by the circuit 106. The signal INTA may implement an intermediate signal within the LNA 100. The signal INTA may convey an amplified version of the receive data/leaked transmit data from the signal RFIN. The circuit 104 may generate a signal (e.g., INTB) received by the circuit 106. The signal INTB may implement an intermediate signal within the LNA 100. The signal INTB may carry an amplified version of the fractional transmit data in the signal TXFB. A signal (e.g., COMB) may be generated by the circuit 106 and received by the circuit 108. The signal COMB may be a combined signal. The signal COMB may carry a result of a combination of the signals INTA and INTB (e.g., the receive data with the leaked transmit data removed).

The circuit 102 may implement an amplifier gain stage of the LNA 100. In some embodiments, the amplifier 102 may implement a low-noise amplifier stage. The amplifier 102 is generally operational to amplify the receive data/leaked transmit data in the signal RFIN. The amplification is generally designed to work on low power signals and to introduce a low amount of noise during the amplification.

The amplified data may be presented in the intermediate signal INTA to the circuit 106.

The circuit 104 may implement an amplifier gain stage of the LNA 100. In various embodiments, the amplifier 104 may implement a low-noise amplifier stage. The amplifier 104 is generally operational to amplify the fractional transmit data portion in the signal TXFB. The amplification is generally designed to work on lower power to modest power signals and to introduce a low amount of noise during the amplification. The amplified data may be presented in the intermediate signal INTB to the circuit 106.

The circuit 106 may implement a combiner circuit. The combiner 106 may be operational to combine the receive data/leaked transmit data in the signal INTA with the fractional transmit data portion in the signal INTB. The combination generally cancels the leaked transmit data in the signal INTA by subtracting the fractional transmit data portion in the signal INTB. A result of the cancellation generally leaves the received data alone in the signal COMB.

The circuit 108 may implement one or more amplifier gains stages of the LNA 100. In some embodiments, each amplifier gain stage may implement a low-noise amplifier stage. The amplifier 108 is generally operational to amplify the receive data in the signal COMB. The amplification is generally designed to work on low power signals and to introduce a low amount of noise during the amplification. The amplified receive data may be presented in the signal OUT.

Overall, the amplifier 102 is designed to have a high linearity (e.g., IP1 dB>4 dBm to approximately 14 dBm). After the combiner 106, the dynamic range of the signal may be reduced by several tens of decibels (e.g., >20 dB). While each amplifier 102 and 108 might have gains of several tens of decibels (e.g., approximately 20 dB to approximately 35 dB), the amplifier 108 generally receives signal power levels matching the transmit power level (e.g., approximately 34 dBm peak power, approximately 24 dBm average power) minus the isolation through the circulator 74 (e.g., approximately 20 dB), plus the gain of the amplifier 102 (e.g., approximately 20 dB), and minus the cancellation in the combiner 106 (e.g., approximately −20 dB). For example, power values received at an input node of the amplifier 108 via the signal COMB may be 34 dBm−20 dB+20 dB−20 dB=14 dBm. A power handling capability of the amplifier 108 may be similar to that of the amplifier 102, rather than being increased by the gain of the amplifier 102 as is typical in a receiver cascade. In some situations, a dynamic range of the amplifier 108 may be reduced even further by achieving better cancellation at the combining point of the combiner 106.

Figure 3:
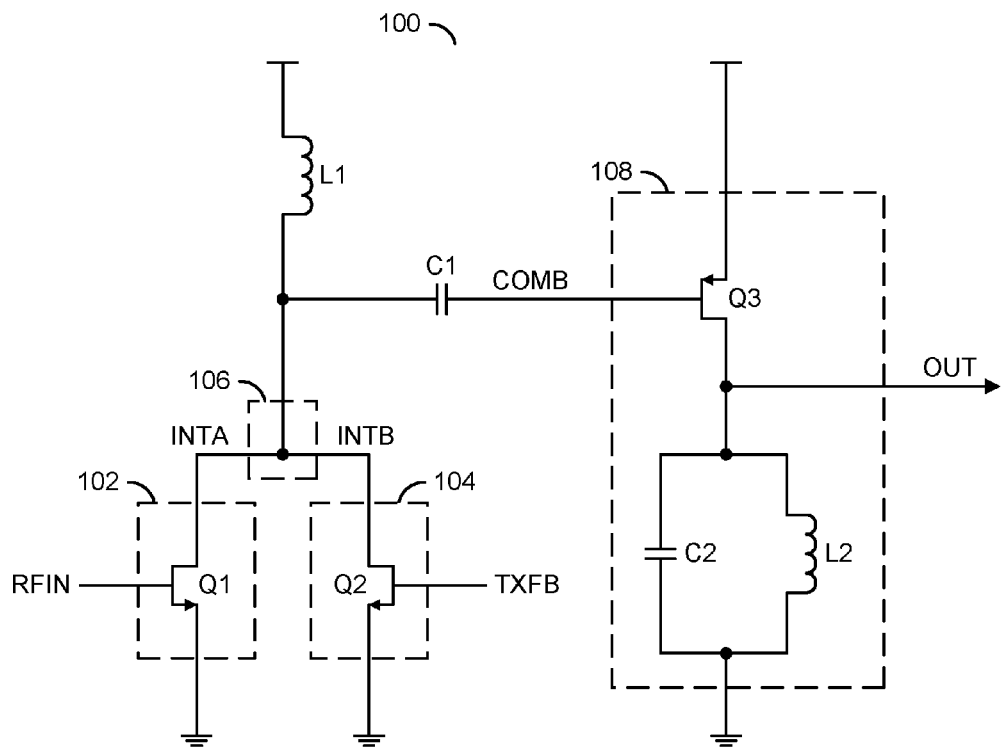
FIG. 3 is a schematic of the low-noise amplifier in FIG. 2.

Referring to FIG. 3, a schematic of an example implementation of the LNA 100 is shown. The amplifier 102 generally comprises a transistor Q1. The amplifier 104 generally comprises a transistor Q2. The combiner 106 generally comprises a node that couples drain nodes of the transistors Q1 and Q2 with an inductor L1 and a capacitor C1. In various embodiments, the inductor L1 and/or the capacitor C1 may be part of the combiner 106. The amplifier 108 generally comprises a transistor Q3, an inductor L2 and a capacitor C2.

The signal RFIN may be received at a gate node of the transistor Q1. The signal TXFB may be received at a gate node of the transistor Q2. The signal INTA may be generated at a drain node of the transistor Q1. The signal INTB may be generated at a drain node of the transistor Q2. The signal COMB may be generated at a node between the combiner 106 and the inductor L1. The signal COMB may be received at a gate node of the transistor Q3. The signal OUT may be generated at a drain node of the transistor Q3.

The transistor Q1 of the amplifier 102 may be implemented as a field effect transistor. The transistor Q1 may have a source node connected to a signal ground of a power (or voltage) domain. The drain node of the transistor Q1 may be biased through the inductor L1 from a positive voltage rail (e.g., VDD) of the power domain. The transistor Q1 may respond the data in the signal RFIN to change a current flowing through the inductor L1. The transistor Q1 may be configured to accommodate the low amount of power available in the signal RFIN. In various embodiments, the transistor Q1 may be implemented as an NMOS transistor. Other transistor types may be implemented to meet the design criteria of a particular application.

The transistor Q2 of the amplifier 104 may be implemented as a field effect transistor. The transistor Q2 may have a source node connected to the signal ground. The drain node of the transistor Q2 may be biased through the inductor L1 from the positive voltage rail. The transistor Q2 may respond the data in the signal TXFB to change the current flowing through the inductor L1. The transistor Q2 may be configured to accommodate the modest amount of power available in the signal TXFB. In various embodiments, the transistor Q2 may be implemented as an NMOS transistor. Other transistor types may be implemented to meet the design criteria of a particular application.

The combiner 106 may be implemented as a wired-OR connection (or node). The current flowing through the wired-OR node due to the transistors Q1 and Q2 may subtract (or cancel) the cancellation data in the signal TXFB from the leaked transmit data in the signal RFIN. The combined signals may be presented from the wired-OR signal in the signal COMB, through the capacitor C1, and to the gate node of the transistor Q3. The lack of active devices in the combiner 106 generally means that little to no additional noise is added to the signals by the combiner 106.

The transistor Q3 of the amplifier 108 may be implemented as a field effect transistor. The transistor Q3 may have a source node connected to the positive voltage rail of the power domain. The source node of the transistor Q3 may be biased from the positive voltage rail. The transistor Q3 may respond the data in the signal COMB to change a current flowing through the inductor L2 and the capacitor C2. The capacitor C2 and the inductor L2 may be connected in parallel to each other and between a drain node of the transistor Q3 and the signal ground. In various embodiments, the transistor Q3 may be implemented as a PMOS transistor. Other transistor types may be implemented to meet the design criteria of a particular application.

Although described in terms of field effect transistors, the transistors Q1, Q2 and/or Q3 may be implemented as other transistor types in other designs. In some embodiments, the transistors Q1, Q2 and/or Q3 may be implemented as bipolar junction transistors. The inductor L1 and the capacitor C1 may be example components used to tune an output of the amplifier 102. For example, the inductor L1 and the capacitor C1 may be used to match the parallel output impedances of the transistors Q1 and Q2 (or just the transistors Q1 in the case of FIG. 6). The transistors Q1 and Q2 may be tuned with additional passive elements to optimize a gain, a linearity, a noise factor and/or match for frequency of operation.

Figure 4:
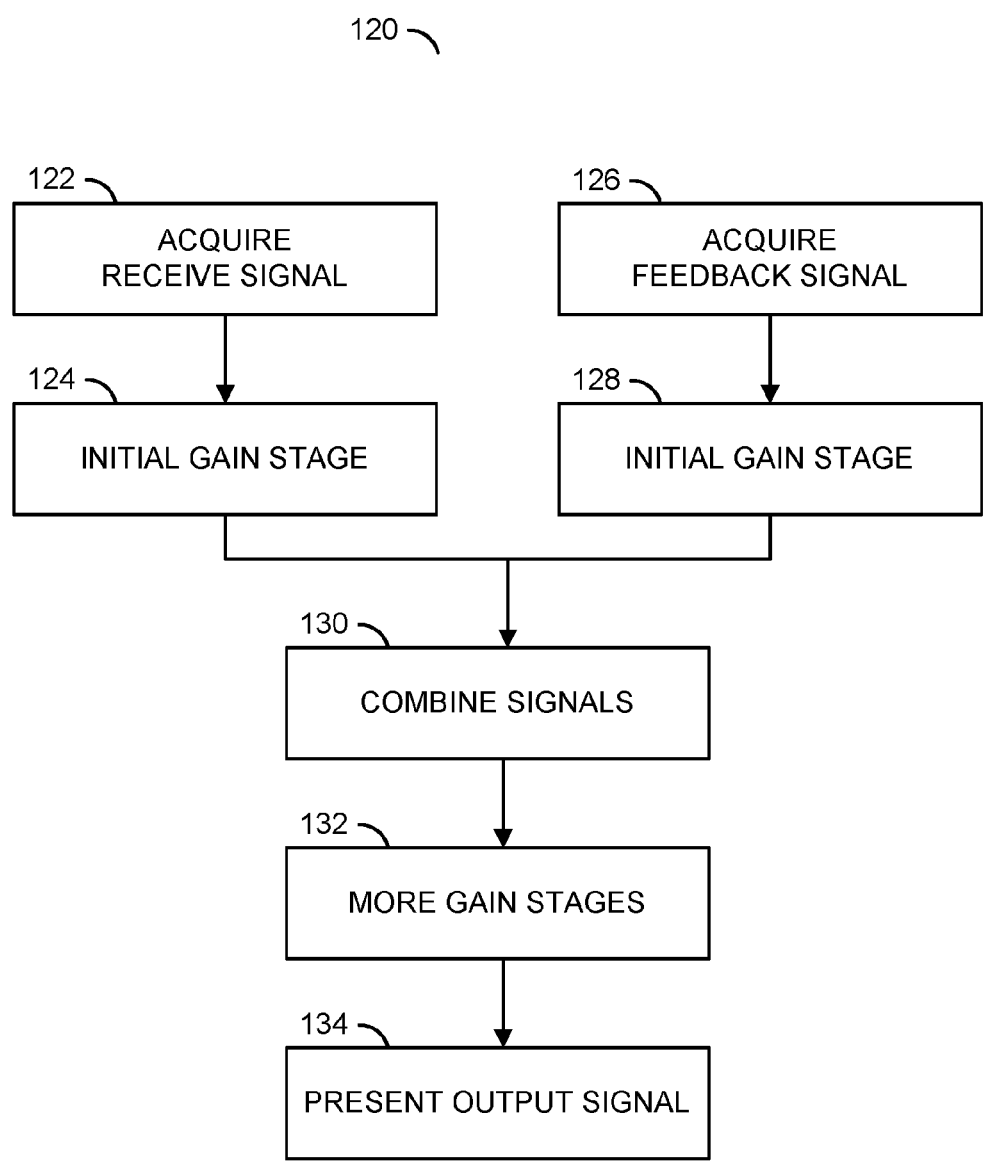
FIG. 4 is a flow diagram of a cancellation operation.

Referring to FIG. 4, a flow diagram of an example cancellation operational 120 is shown. The operation (or method or process) 120 may be implemented in the LNA 100. The method 120 generally comprises a step (or state) 122, a step (or state) 124, a step (or state) 126, a step (or state) 128, a step (or state) 130, a step (or state) 132, and a step (or state) 134.

In the step 122, the amplifier 102 may acquire (or receive) the receive data/leaked transmit data in the signal RFIN. The amplifier 102 may provide an initial gain stage amplification of the input data in the step 124. In parallel with the step 122, the amplifier 104 may acquire (or receive) the fractional portion of the transmit data in the signal TXFB in the step 126. In parallel with the step 124, the amplifier 104 may provide an initial gain stage amplification of the cancellation feedback data in the step 128.

In the step 130, the combiner 106 may combine the signals INTA and INTB to cancel the leaked transmit data from the combined receive data/leaked transmit data. The amplifier 108 may amplify the remaining transmit data in the step 132 using one or more additional gain stages. In the step 134, a last gain stage in the amplifier 108 may present the amplified receive data in the signal OUT.

Figure 5:
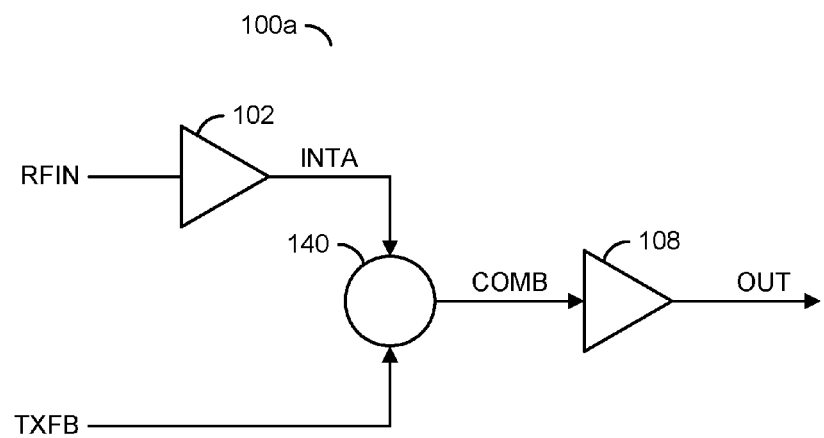
FIG. 5 is a block diagram of another low-noise amplifier.

Referring to FIG. 5, a diagram of an example implementation of an LNA circuit 100a is shown. The LNA 100a may be a variation of the LNA 100. The LNA 100a generally comprises the amplifier 102, the amplifier 108 and a block (or circuit) 140.

The signal RFIN may be received by the amplifier 102. The amplifier 102 may present the signal INTA to the circuit 140. The signal TXFB may be received by the circuit 140. The circuit 140 may present the signal COMB to the amplifier 108. The signal OUT may be generated by the circuit 108.

The circuit 140 may be implemented as a combiner circuit. The combiner 140 may be a variation on the circuit 106 with the signal TXFB being received in place of the signal INTB. The combiner 140 may be configured to accommodate the modest amount of power available in the signal TXFB. A presence of an amplifier propagation delay (e.g., the delay through the amplifier 102) in the path of the signal RFIN, and an absence of a similar propagation delay in the path of the signal TXFB may be accounted for by adjusting the phase of the cancellation feedback data in the circuit 78.

Figure 6:
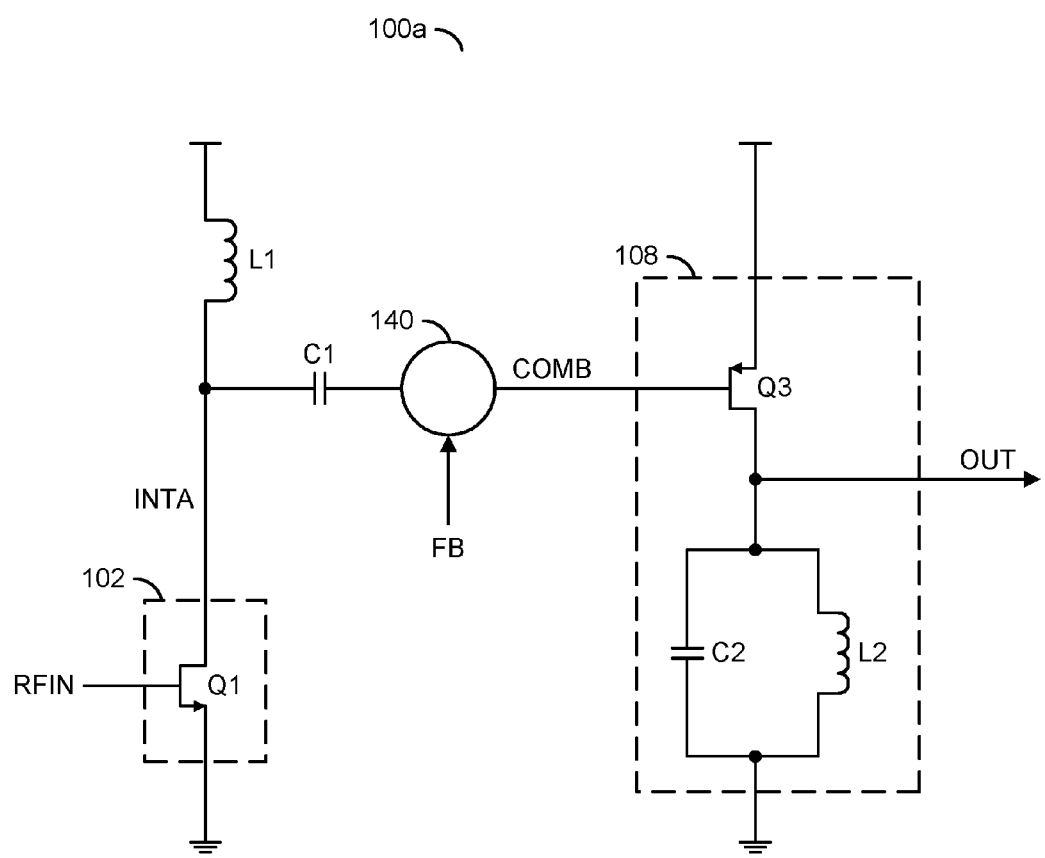
FIG. 6 is a schematic of the low-noise amplifier in FIG. 5.

Referring to FIG. 6, a schematic of an example implementation of the LNA 100a is shown. The amplifier 102 generally comprises the transistor Q1. The inductor L1 may be connected to the drain node of the transistor Q1. The capacitor C1 may connect the drain node of the transistor Q1 to the combiner 140. The amplifier 108 generally comprises the transistor Q1, the inductor L2 and the capacitor C2.

The signal RFIN may be received at the gate node of the transistor Q1. The signal TXFB may be received at an input node of the combiner 140. The signal INTA may be generated at the drain node of the transistor Q1. The signal COMB may be generated at an output node or the combiner 140. The signal COMB may be received at the gate node of the transistor Q3. The signal OUT may be generated at the drain node of the transistor Q3.

The combiner 140 may be implemented as a power combiner circuit (or network). The combiner 140 may be designed to handle the modest power levels in the signal TXFB (e.g., dBm). In various embodiments, the combiner 140 may be implemented as a passive power combiner, such as a hybrid coupler, a Wilkinson power combiner (see "An N-way Power Divider" by E. Wilkinson, IEEE Transactions on Microwave Theory and Techniques, MTT-8, No. 1, January 1960, pages 116-118), or a resistive combiner.

Figure 7:
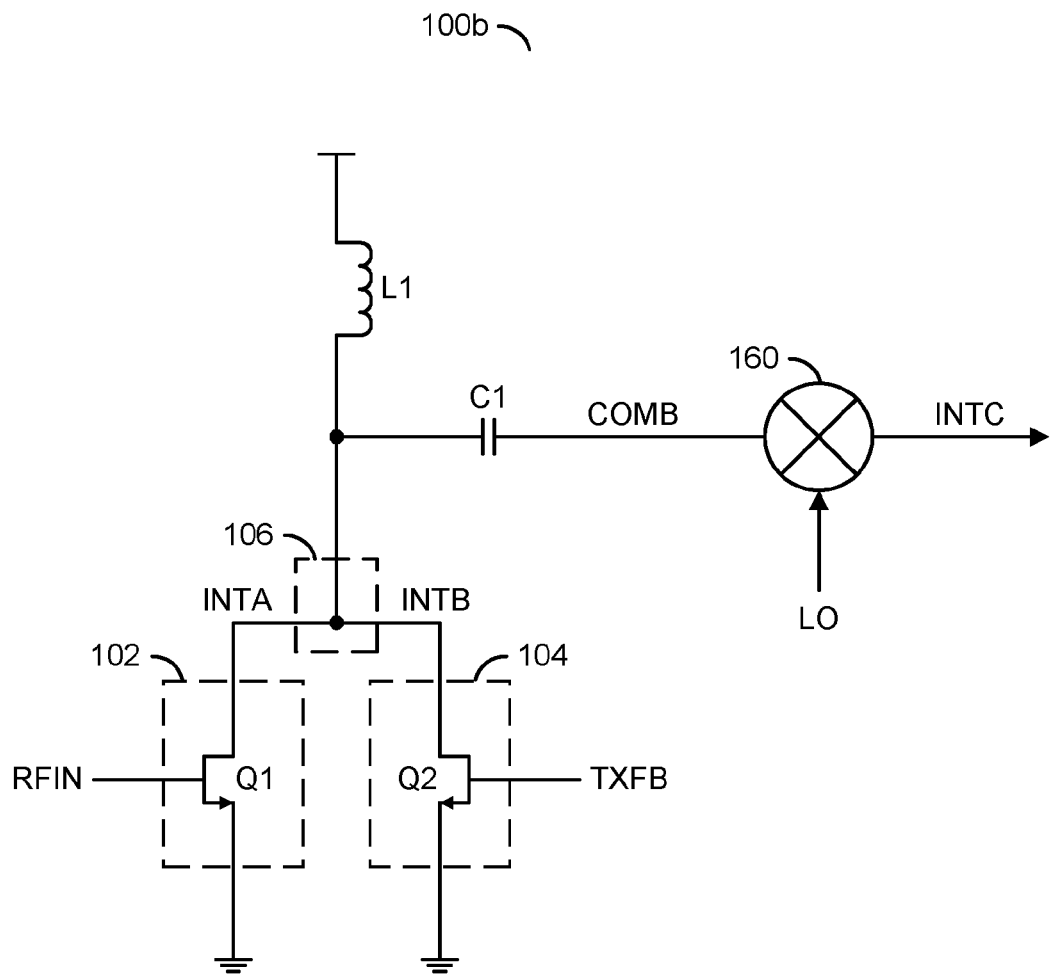
FIG. 7 is a schematic of another low-noise amplifier.

Referring to FIG. 7, a schematic of an example implementation of an LNA circuit 100b is shown. The LNA 100b may be a variation of the LNA 100. The LNA 100b generally comprises the amplifier 102, the amplifier 104, the combiner 106 and a block (or circuit) 160.

The signal RFIN may be received at the gate node of the transistor Q1. The signal TXFB may be received at the gate node of the transistor Q2. The signal INTA may be generated at the drain node of the transistor Q1. The signal INTB may be generated at the drain node of the transistor Q2. The signal COMB may be generated at the node between the combiner 106 and the inductor L1. The signal COMB may be received at an input node of the circuit 160. A signal (e.g., LO) may be received at another input node of the circuit 160. The signal LO may implement a local oscillator signal. A signal (e.g., INTC) may be generated by the circuit 160. The signal INTC may implement an intermediate signal within the LNA 100b that carries the receive data. In some embodiments, the signal INTC may be transferred to the amplifier 108 for additional amplification. In other embodiments, the signal INTC may be the same as the signal OUT.

The circuit 160 may implement a mixer circuit. The mixer 160 is generally operational to mix (e.g., heterodyne) the signal COMB with the signal LO. The signal INTC may convey the receive data from the signal COMB at a different frequency than as originally received in the signal ANT, depending on a local oscillator frequency in the signal LO. In some embodiments, the mixer 160 may reduce a frequency ($F_{COMB}$) in the signal COMB by the local oscillator frequency ($F_{LO}$) in the signal LO to generate the receive data at a lower frequency in the signal INTC (e.g., $F_{INTC}=F_{COMB}-F_{LO}$). In other embodiments, the mixer 160 may increase the frequency of the receive data in the signal COMB by the local oscillator frequency in the signal LO to generate the receive data at a higher frequency in the signal INTC (e.g., $F_{INTC}=F_{COMB}+F_{LO}$).

Figure 8:
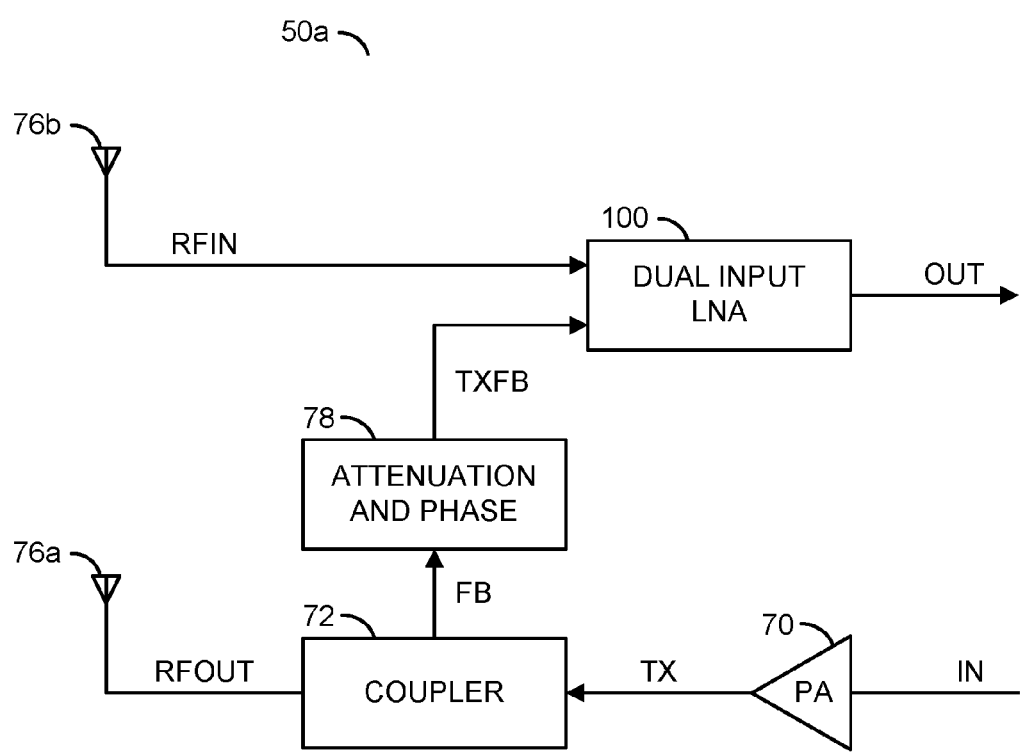
FIG. 8 is a block diagram of an apparatus with dual antennae.

Referring to FIG. 8, a block diagram of another apparatus 50a is shown. The apparatus (or system or circuit or integrated circuit) 50a may implement a transmit/receive (T/R) device (or module). The apparatus 50a may be a variation of the apparatus 50.

The apparatus 50a generally comprises the power amplifier 70, the coupler 72, an antenna 76a, an antenna 76b, the circuit 78 and the LNA 100. In various embodiments, the apparatus 50a may be implemented as one or more integrated circuits.

The antenna 76a may implement a transmit (TX) antenna. The TX antenna 76a may receive the signal RFOUT directly from the circuit 72. The TX antenna 76a may be configured to broadcast the signal RFOUT as a radio frequency signal over the airwaves.

The antenna 76b may implement a receive (RX) antenna. The RX antenna 76b is generally operational to receive a radio frequency signal from the airwaves to create the signal RFIN. The signal RFIN may be presented directly to the LNA 100.

In various embodiments, the TX antenna 76a and the RX antenna 76b may be located near each other and operate at or near the same frequency. Radiation transmitted by the TX antenna 76a may be received by the RX antenna 76b and so the transmit data in the signal RFOUT is combined with intended receive data at the RX antenna 76b. A typical isolation between the signal RFOUT broadcast by the TX antenna 76a and the signal RFIN received by the RX antenna 76b may be approximately several tens of decibels (dB) (e.g., approximately 20 dB). As such, leakages of the transmit data in the signal RFOUT into the signal RFIN may be in a range of approximately several decibel-milliwatts (e.g., approximately 4 dBm to approximately 20 dBm).

Figure 9:
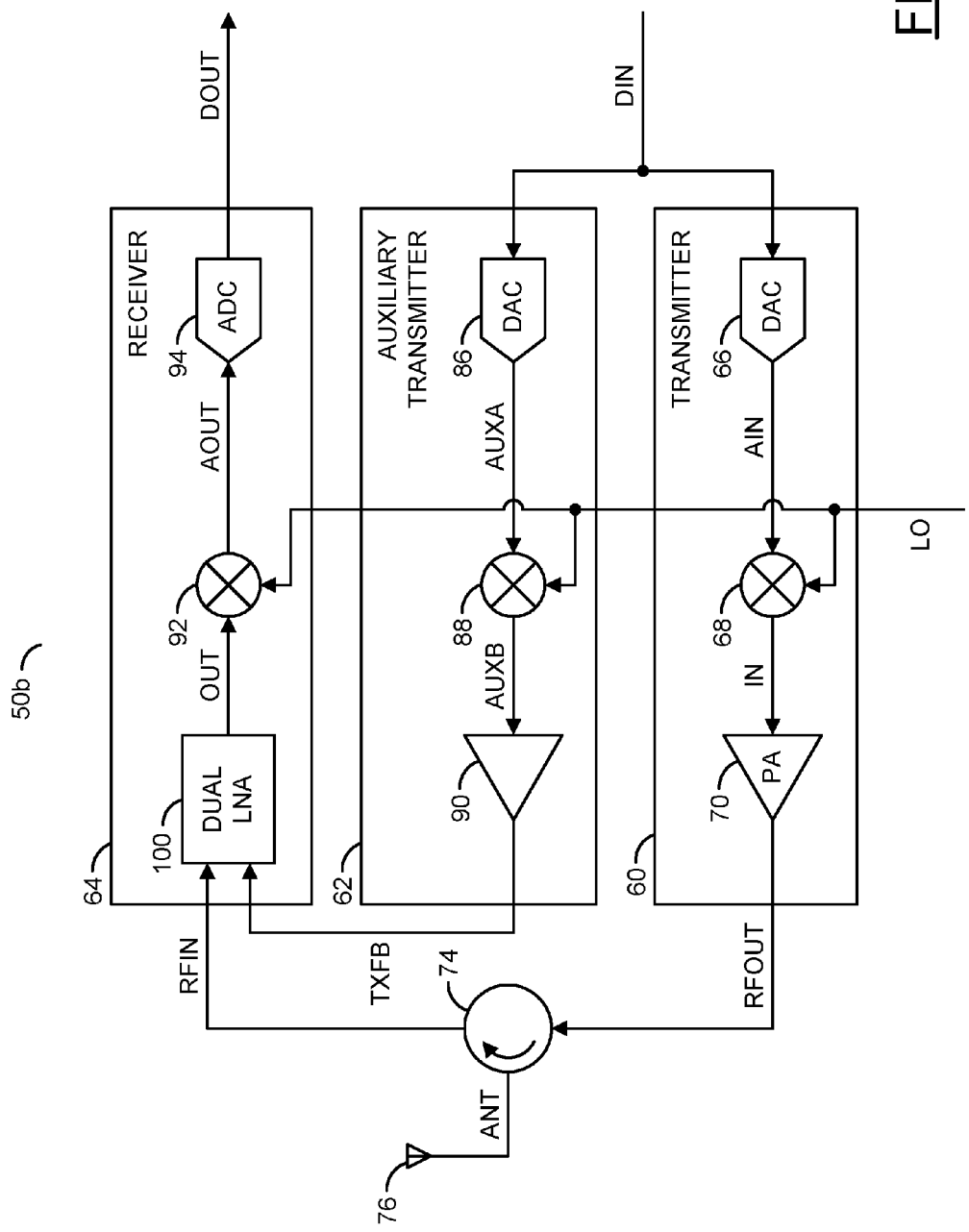
FIG. 9 is a block diagram of an apparatus with an auxiliary transmitter.

Referring to FIG. 9, a block diagram of another apparatus 50b is shown. The apparatus (or system or circuit or integrated circuit) 50b may implement a transmit/receive (T/R) device (or module). The apparatus 50b may be a variation of the apparatus 50 and/or the apparatus 50a. In various embodiments, the apparatus 50b may be implemented as one or more integrated circuits.

The apparatus 50b generally comprises a transmitter block (or circuit) 60, an auxiliary transmitter block (or circuit) 62 and a receiver block (or circuit) 64. The transmitter circuit 60 generally comprises a digital-to-analog converter (DAC) 66, a mixer 68 and the power amplifier 70. The auxiliary transmitter block 62 generally comprises a digital-to-analog converter 86, a mixer 88 and an amplifier 90. The receiver circuit 64 generally comprises the LNA 100, a mixer 92 and an analog-to-digital converter (ADC) 94.

In the transmitter 60, a signal (e.g., DIN) may be received by the DAC 66. The signal DIN may convey input data in digital form for transmission. A signal (e.g., AIN) may be generated by the DAC 66 and received by the mixer 68. The signal AIN may convey the input data to be transmitted in analog form. The signal LO may be received by the mixer 68. The mixer 68 may up convert the signal AIN using the signal LO to generate the signal IN. The power amplifier 70 may generate the signal RFOUT.

In the auxiliary transmitter 62, the signal DIN may be received by the DAC 86. A signal (e.g., AUXA) may be generated by the DAC 86 and received by the mixer 88. The signal AUXA may convey the input data in analog form. The signal LO may be received by the mixer 88. The mixer 88 may generate a signal (e.g., AUXB) received by the amplifier 90. The signal AUXB may convey the input data up converted using the signal LO. The amplifier 90 may generate the signal TXFB.

In the receiver 64, the signals RFIN and TXFB may be received by the LNA 100. The signal OUT may be generated by the LNA 100 and transferred to the mixer 92. The signal LO may be received by the mixer 92. A signal (e.g., AOUT) may be generated by the mixer 92 and presented to the ADC 84. The signal AOUT may carry the receive data in analog form and down converted using the signal LO. The ADC 94 may generate a signal (e.g., DOUT). The signal DOUT generally conveys the down-converted receive data in digital form.

The auxiliary transmitter 62 may be configured to mimic the time delay and phase adjustments of the transmitter 60 and the coupling of the transmitted signal from the TX antenna 76a to the RX antenna 76b. The amplifier 90 may generate the transmit data in the signal TXFB as an attenuated version of the signal RFOUT. The transmit data generated by the amplifier 90 may be designed to match the leakage of the transmit data from the signal RFOUT into the signal REIN.

The functions and structures illustrated in the diagrams of FIGS. 1 to 9 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems. As used herein, the term "simultaneously" is meant to describe events that share some common time period but the term is not meant to be limited to events that begin at the same point in time, end at the same point in time, or have the same duration.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
  a first input node that acquires a receive signal;
  a second input node that acquires a cancellation signal and is separate from said first input node;
  a first gain circuit configured to amplify said receive signal acquired through said first input node to generate an intermediate signal;
  a combiner circuit configured to combine said intermediate signal with said cancellation signal acquired through said second input node to generate a combined signal, wherein (i) said cancellation signal is an attenuated version of a transmit signal and (ii) a portion of said transmit signal appears in said receive signal acquired through said first input node; and
  a second gain circuit configured to amplify said combined signal to generate an output signal, wherein said first input node, said second input node, said first gain circuit, said combiner circuit and said second gain circuit form a low-noise amplifier.

2. The apparatus according to claim 1, wherein said receive signal comprises one of a radio frequency signal, a microwave signal and a millimeter wave signal.

3. The apparatus according to claim 1, wherein said first gain circuit comprises a field effect transistor having a drain node biased by said combiner circuit.

4. The apparatus according to claim 3, wherein said second gain circuit comprises another field effect transistor having a gate node configured to acquire said combined signal from said combiner circuit.

5. The apparatus according to claim 1, further comprising an amplifier (i) connected between said second input node and said combiner circuit and (ii) configured to amplify said cancellation signal.

6. The apparatus according to claim 5, wherein (i) said first gain circuit comprises a field effect transistor having a drain node biased by said combiner circuit and (ii) said amplifier comprises another field effect transistor having a drain node biased by said combiner circuit and wired in parallel to said field effect transistor in said first gain circuit.

7. The apparatus according to claim 1, wherein said combiner circuit comprises a wired-OR connection configured to receive both said intermediate signal and said cancellation signal.

8. The apparatus according to claim 1, wherein said receive signal is acquired from one of a circulator circuit and a receive antenna.

9. The apparatus according to claim 1, further comprising a mixer circuit (i) located between said combiner circuit and said second gain circuit and (ii) configured to change a frequency of said combined signal using a local oscillator signal.

10. The apparatus according to claim 1, wherein said cancellation signal conveys greater than zero decibel-milliwatts of peak power.

11. The apparatus according to claim 1, wherein said first gain circuit has an input 1 dB compression point of at least 4 decibel-milliwatts.

12. The apparatus according to claim 1, wherein said first gain circuit, said combiner circuit and said second gain circuit are part of a full duplex wireless transceiver.

13. A method for dual-input low noise amplification, comprising the steps of:
  amplifying a receive signal in a first gain circuit to generate an intermediate signal, wherein said receive signal is acquired through a first input node;
  combining said intermediate signal with a cancellation signal in a combiner circuit to generate a combined signal, wherein (i) said cancellation signal is acquired through a second input node that is separate from said first input node, (ii) said cancellation signal is an attenuated version of a transmit signal, and (iii) a portion of said transmit signal appears in said receive signal acquired through said first input node; and
  amplifying said combined signal in a second gain circuit to generate an output signal, wherein said first input node, said second input node, said first gain circuit, said combiner circuit and said second gain circuit form a low-noise amplifier.

14. The method according to claim 13, wherein said receive signal comprises one of a radio frequency signal, a microwave signal or a millimeter wave signal.

15. The method according to claim 13, further comprising the step of:
  amplifying said cancellation signal between said second input node and said combiner circuit.

16. The method according to claim 13, further comprising the step of:
  heterodyning said combined signal between said combiner circuit and said second gain circuit using a local oscillator signal.

17. The method according to claim 13, wherein said cancellation signal conveys between 10 decibel-milliwatts and 30 decibel-milliwatts of power.

18. The method according to claim 13, wherein said first gain circuit has an input 1 dB compression point of at least 4 decibel-milliwatts.

19. The method according to claim 13, wherein the steps are performed in a full duplex wireless transceiver.

20. An apparatus comprising:
  a circulator circuit configured to (i) transfer an antenna signal to a receive signal and (ii) transfer a transmit signal to said antenna signal, wherein a portion of said transmit signal appears in said receive signal;
  an attenuator circuit configured to attenuate and phase shift a cancellation signal derived from said transmit signal; and
  a low-noise amplifier (i) comprising a plurality of gain circuits, a first input node that acquires said receive signal and a second input node that acquires said cancellation signal and is separate from said first input node and (ii) configured to (a) combine said receive signal with said cancellation signal after a first gain circuit of said plurality of gain circuits to generate a combined signal and (b) amplify said combined signal in a second gain circuit of the plurality of gain circuits to generate an output signal.

* * * * *